Nov. 29, 1966 C. W. VAN HISE 3,287,794

METHOD OF SOLDERING SEMICONDUCTOR DISCS

Filed March 23, 1962

INVENTOR
Charles W. Van Hise
BY
Tennes I. Erstad
ATTORNEY

United States Patent Office 3,287,794

Patented Nov. 29, 1966

3,287,794

METHOD OF SOLDERING SEMICONDUCTOR DISCS

Charles W. Van Hise, Colonia, N.J., assignor to American Radiator & Standard Sanitary Corporation, New York, N.Y., a corporation of Delaware Filed Mar. 23, 1962, Ser. No. 181,914

4 Claims. (Cl. 29—155.5)

This invention relates to semiconductor thermoelements and particularly to improved methods for bonding said elements and to improved apparatus employing such elements. The invention is especially well-adapted for use in heating and cooling apparatus employing thermoelements.

In order to use thermoelectric elements in a cooling and heating apparatus, it is necessary that the mechanical and electrical junctions which connect pairs of thermoelements with metallic conductors be sound. This means for example, it would be desirable for the electrical contact resistance of a single junction be of an order of one micro-ohm and the joint would be of a tensile strength that it can withstand a load of at least 50 lb./cm.$^2$. Heretofore when semiconductors were bonded to metallic conductors, the bond would break away from the semiconductor. There was a special tendency for the bond to begin peeling away from the corner of the semiconductor. This weakness was aggravated by the cyclical heating and cooling that the apparatus undergoes together with the tensile forces which are exerted on the apparatus due to ordinary mechanical handling of the apparatus.

It is an object of this invention to provide an improved bond and method for joining semiconductor materials to metallic conductors which will be capable of withstanding thermal stresses and strains resulting from temperature changes and the expansion and contraction resulting therefrom without causing a break or fracture in the bond.

Another object of this invention is to provide an improved arrangement and construction of semiconductor elements for use in heating and cooling apparatus and other applications.

A further object is to provide a method for preparing semiconductors for bonding to a metallic conductor.

Other objects and features of the invention will appear as the description of the particular physical embodiment selected to illustrate the invention progresses. In the accompanying drawings, which form a part of this specification, like characters of reference have been applied to corresponding parts throughout the several views which make up the drawings.

The type of semiconductor material employed to illustrate the invention are known as bismuth-telluride thermoelectric units and are commercially available in cylindrical form and of predetermined heights and resemble thick buttons or discs 10.

Figure 1:
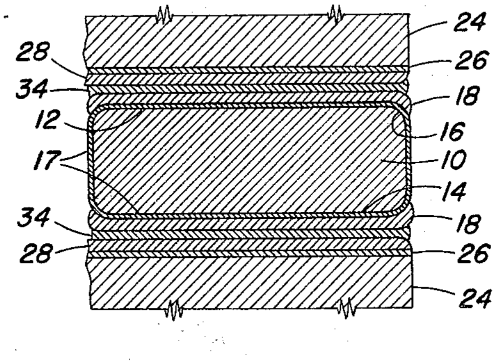
FIGURE 1 shows an enlarged cross-sectional side elevation of my improved semiconductor bond formed pursuant to my new method of joining a semiconductor to a metallic conductor.

The surfaces 12 and 14 of these discs 10 are roughened, either by scraping, sandpapering, sand blasting or any other suitable way. The corners 16 of each thermoelement 10 is rounded in order to increase the mechanical bond strength of the nickel plating to the thermoelement. It has been found that when the corners 16 are rounded, such as shown in FIGURE 1, the torsion strength is increased considerably and this avoids any tendency for the nickel plating to peel.

When the thermoelements 10 have been prepared in this manner, they are submersed in a nickel-electro-plating bath. The following bath composition has been found to be very satisfactory:

115 cc. of water
2.3 grams ammonium chloride
11.7 grams nickel sulphate
17.0 grams sodium sulphate
2.3 grams boric acid A low plating current density of 5 ma./cm.$^2$ is used to effect the nickel plating 17. After the thermoelements 10 are nickel-plated in this manner, they are then capped with lead-tin solder (183° C. eutectic), as indicated by the reference character 18, using a non-corrosive resin flux. The thickness of the nickel plating applied to the thermoelement may be relatively thin, less than 1 x 10.4 centimeters for example, which is sufficient for the function it performs. The equivalent circuit to the nickel plating and the thermoelements is just two resistances in parallel, one the resistance of the nickel and the other the resistance of the thermoelement.

Figures 2, 3:
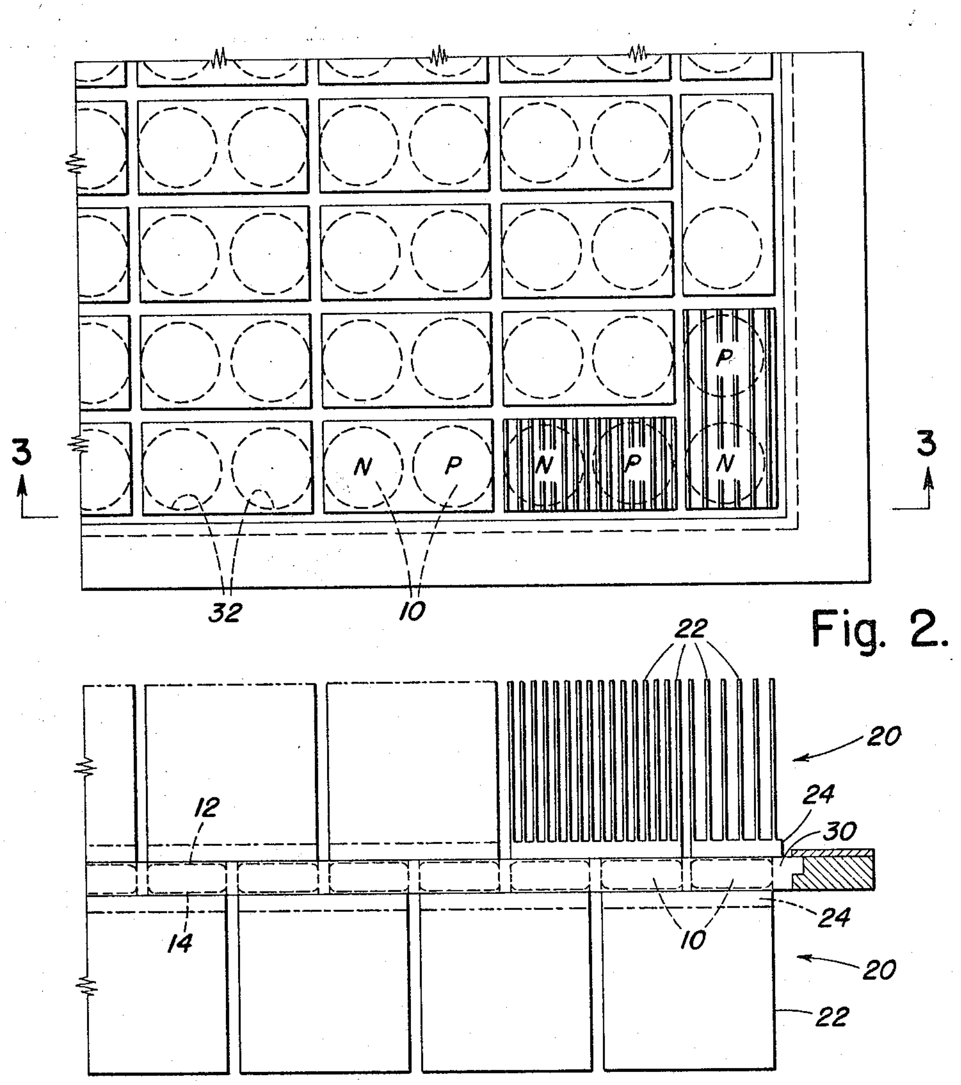
FIGURE 2 shows a partial sectional top view showing one manner of mounting and arranging such improved bonded semiconductors.
FIGURE 3 shows a partial side view taken on line 3—3 of FIGURE 2.

To achieve a heating and cooling effect, the thermoelements are bonded to individual metallic conductors 20 which have radiating fins 22 extending from one side. These conductors are made from aluminum because of its light weight, and are of a length sufficient to connect two semiconductors (P type and N type) together as shown in FIGURE 2. In the past there have been some problems with respect to bonding thermoelements to such aluminum conductors. The base surface 24, to which the thermoelectric elements 10 are to be bonded are prepared as follows:

The aluminum base 24 of each aluminum connector 20 is heated to about 220° C. The base surface 24 is then covered with a alloy of approximately 70 percent tin and 30 percent zinc. A thin layer of lead-tin eutectic 28 is deposited on top of the alloy of tin-zinc 26. After cooling, the base surface 24 is then leveled on suitable device such as a sanding machine or sanding disk.

When the thermoelements 10 and the aluminum finned metallic conductors 24 have been prepared individually for bonding, in the manner described, the individual units 10 and 24 may then be bonded together into an integrated device which will provide a reliable and improved thermoelectric device for use in a heating and cooling apparatus.

For this purpose, I employ a strip 30 which is made of laminated thermosetting plastic material such as a woven glass fabric base laminate bonded with melamine resin. This strip of plastic material 30 is a nonconductor and has holes 32 formed therein which are of a size adapted to receive individual thermoelements 10 and to laterally support the same since the holes 32 are approximately the same diameter as that of the thermoelement semiconductors 10.

The plastic strips 30 are then placed in a suitable holding jig (not shown). The capped N and P type thermoelements 10 are then alternately placed into the strip holes 32 as shown in FIGURES 2 and 3. The capping 18 of the thermoelements is then covered with a non-corrosive resin flux. Two wafers of indium-tin eutectic (each of 0.625 inch diameter and 0.004 inch thick) 34 are placed on each side of the thermoelement.

The bases 24 of the finned aluminum connectors 20, which were previously prepared in the manner described above are then also covered with the resin flux. These finned connectors 20 are then assembled into the jig and positioned next to two wafers 34 of indium-tin eutectic just described. The assembled jig is then placed in a pre-heated 130° C. oven for a period of one hour.

Since the melting point of the indium-tin wafers 34 is approximately 117° C. the oven temperature of 130° C. is sufficient to melt the wafer 34. The lead-tin capping (183° C. eutectic) 18 of the thermoelements will obviously not remelt at this oven temperature. The strips of alternately bonded and serially connected P and N thermoelements 10 are thereby joined into an assembly as shown in FIGURE 3 which may be conveniently located in a relatively thin space. This assembly may, of course, be placed in a suitable housing so as to provide additional mechanical support for the assembly, as shown in FIGURES 2 and 3.

As indicated and described above, the rounding of the corners of the thermoelements increases the effective plating area of the top and bottom portions of the cylindrical thermoelement semiconductors. The electrical resistance of the bond is reduced due to there being more surface area for conducting the electricity and the mechanical strength is also increased. While the tensile strength is increased in proportion to the increased area of plating, the sheer strength is increased by a higher factor since a part of the plating is now at right angles to the sheering force.

The forces which formerly acted to destroy the bond by virtue of the large stresses existing at the sharp angular boundary are now dispersed over a larger area. In consequence of this forced dispersion the bond is now no longer subject to the stresses which lead to peeling and destruction of the bond. As a result the effective strength of the bond is substantially increased.

The radius of curvature of the rounded corner is, for example, shown in FIGURE 1 as being about 10 percent of the height of the semiconductor 10 resulting in a considerable increase in the torsion strength. The least rounding of the corners which provides the desired effect has found to produce satisfactory results. For thermoelements which have a comparatively small height relative to the diameter, a radius of curvature of the rounded corners of about 10 percent of the height has been found to be satisfactory. For larger heights of the thermoelements relative to the diameter, the 10 percent figure will, of course, be reduced. This technique thus avoids the tendency for the nickel to peel from the corners as was previously experienced and mentioned above when the edges or corners were not rounded. It will be appreciated that while I have described the semiconductor as being nickel plated, it could be plated with some other suitable plating material. When electrical current is passed through the serially connected semiconductors, heat will be dissipated from one side of the joined semiconductors, while heat will be absorbed on the other side of the semiconductors.

The construction and arrangement of the thermoelements I have shown and described lends itself to many applications where there is a problem of joining semiconductor material to metallic conductors. It is particularly well suited for use in such situations where there are mechanical stresses exerted on these elements as well as where stresses rise due to expansion and construction arising from changes in temperature as described above.

From the foregoing description, it will be evident that I have provided an improved, structural arrangement for semiconductors which are employed for heating and cooling and wherein the thermal expansion and contraction and the mechanical bending stresses encountered by such structure in operation will not result in the bonds being broken. In addition, I have shown how such improved construction of the thermoelements can be assembled in an apparatus to provide mechanical support.

The invention hereinabove described may, therefore, be varied in construction within the scope of the claims, for the particular device selected to illustrate the invention is but one of many possible embodiments of the same. The invention therefore is not to be restricted to the precise details of the structure shown and described.

What is claimed is:

1. The improved method comprising the steps of forming an insulator wall with a series of spaced holes therethrough; forming semiconductor discs with flat end faces; nickel plating the flat end faces of the discs; forming a series of electrically conductive blocks with flat-faced base portions and spaced fins projecting therefrom; coating the flat face of each block base portion with a layer of high melting point solder; positioning the semiconductor discs in the openings of the insulator wall with their end faces exposed; positioning wafers of low melting point solder on the end faces of the semiconductor discs; positioning the blocks adjacent opposite faces of the insulator wall so that each block has its flat face engaged with low melt solder wafers on two adjacent discs; oven heating the assembled discs and blocks to fuse the solder wafers; and cooling the discs and blocks to a temperature below the fusion point of the wafers.

2. The method of claim 1 and further comprising the steps of forming the semiconductor discs with a cylindrical peripheral face interconnecting the flat end faces; rounding the edge between each flat end face and the peripheral face so that each edge has a discernible radius of curvature; and nickel plating both the flat end faces and the rounded edges.

3. A method of constructing a thermoelectric apparatus comprising the steps of forming an insulator wall with a series of spaced holes therethrough; nickel plating the flat end faces of flat-faced semiconductor discs; coating the plated end faces with a layer of solder having a relatively high melting point; forming a series of electrically conductive blocks with flat-faced base portions and spaced fins projecting therefrom; coating the flat face of each block base portion with a layer of high melting point solder; positioning the semiconductor discs in the openings of the insulator wall with their end faces exposed; positioning wafers of low melting point solder on the soldered end faces of the semiconductor discs; positioning the blocks adjacent opposite faces of the insulator wall so that each block has its flat face engaged with low melt solder wafers on two adjacent discs; oven heating the assembled discs and blocks to a temperature higher than the fusion point of the low melt solder but lower than the fusion point of the high melt solder; and cooling the discs and blocks to a temperature below the fusion point of the low melt solder.

4. The improved method comprising the steps of forming a bismuth telluride disc with a peripheral face and a flat end face; rounding the edge between the flat end face and peripheral face so that said edge has a discernible radius of curvature; nickel plating the flat end face and the rounded edge; forming an aluminum conductor with a flat face; joining the flat faces of the semiconductor disc and conductor with a layer of solder; heating the aluminum conductor prior to its being joined to the semiconductor; coating the conductor flat face with a tin-zinc alloy solution while it is heated; covering the coated flat face with a lead-tin coating while the tin-zinc solution is in a fluid state; and cooling the aluminum conductor prior to joining thereof with the semiconductor.

(References on following page)

References Cited by the Examiner

UNITED STATES PATENTS

| | | | |
|---|---|---|---|
| 300,711 | 6/1884 | Ingersoll | 117—53 X |
| 942,577 | 12/1909 | Lunan et al. | |
| 2,021,157 | 11/1935 | Stahl. | |
| 2,712,563 | 7/1955 | Faus et al. | 136—5 |
| 2,793,420 | 5/1957 | Johnson et al. | 204—49 X |
| 2,844,638 | 7/1958 | Lindenblad | 136—4.2 |
| 2,847,623 | 8/1958 | Thornhill. | |
| 2,848,391 | 8/1958 | Fahnoe et al. | 204—38 |
| 2,870,610 | 1/1959 | Lindenblad. | |
| 2,902,528 | 9/1959 | Rosi | 136—4.2 |
| 2,972,570 | 2/1961 | Haas et al. | 204—38 |
| 2,993,080 | 7/1961 | Poganski | 136—4.2 |
| 2,996,889 | 8/1961 | Roeder | 136—4.2 |
| 3,006,979 | 10/1961 | Rich | 136—4.2 |

FOREIGN PATENTS

| | | |
|---|---|---|
| 1,049,202 | 12/1953 | France. |

OTHER REFERENCES

Mattacotti, V., Cold Nickel Plating and Soft Deposits Monthly Review, vol. 33, pps. 494, 495; 1946.

WINSTON A. DOUGLAS, *Primary Examiner.*

JOHN H. MACK, ALLEN B. CURTIS, *Examiners.*

D. L. WALTON, *Assistant Examiner.*